(12) United States Patent
Ono

(10) Patent No.: US 6,495,890 B1
(45) Date of Patent: Dec. 17, 2002

(54) FIELD-EFFECT TRANSISTOR WITH MULTIDIELECTRIC CONSTANT GATE INSULATION LAYER

(75) Inventor: Mizuki Ono, Zurich (CH)

(73) Assignee: Kabushiki Kaisha Toshiba, Kawasaki (JP)

( * ) Notice: Subject to any disclaimer, the term of this patent is extended or adjusted under 35 U.S.C. 154(b) by 8 days.

(21) Appl. No.: 09/653,254

(22) Filed: Aug. 31, 2000

(30) Foreign Application Priority Data

Sep. 29, 1999 (JP) ............................................ 11-276259

(51) Int. Cl.$^7$ ................................................ H01L 29/94
(52) U.S. Cl. .................... 257/387; 257/386; 257/389; 438/299
(58) Field of Search ................................ 257/386, 387, 257/389; 438/299

(56) References Cited

U.S. PATENT DOCUMENTS 4,183,040 A * 1/1980 Rideout ..................... 257/300
6,274,477 B1 * 8/2001 Hong ......................... 438/624

FOREIGN PATENT DOCUMENTS

JP        02307271 A   * 12/1990  .................. 257/386

* cited by examiner

Primary Examiner—Nathan J. Flynn
Assistant Examiner—Scott R. Wilson
(74) Attorney, Agent, or Firm—Finnegan, Henderson, Farabow, Garrett & Dunner, L.L.P.

(57) ABSTRACT

A field-effect transistor comprises a semiconductor substrate, a gate insulation film formed selectively on the semiconductor substrate, a gate electrode formed on the gate insulation film, source/drain regions formed in surface portions of the semiconductor substrate along mutually opposed side surfaces of the gate electrode, the source/drain regions having opposed end portions located immediately below the gate electrode, each of the opposed end portions having an overlapping region which overlaps the gate electrode, and a channel region formed in a surface portion of the semiconductor substrate, which is sandwiched between the opposed source/drain regions. That portion of the gate insulation film, which is located at the overlapping region where at least one of the source/drain regions overlaps the gate electrode, has a lower dielectric constant than that portion of the gate insulation film, which is located on the channel region. Thereby, a short channel effect can be fully suppressed, and a high-speed operation can be realized.

21 Claims, 7 Drawing Sheets

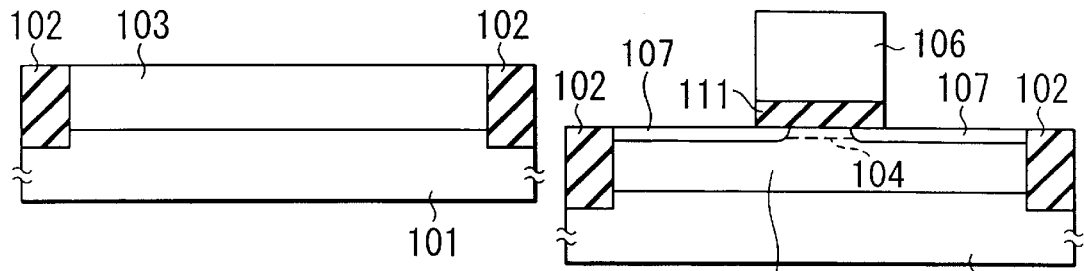
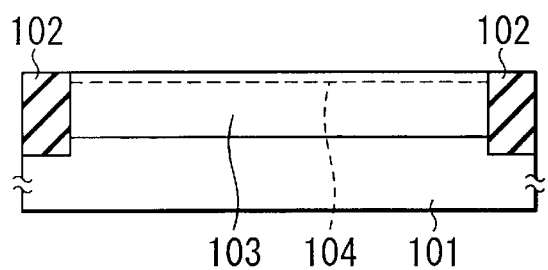
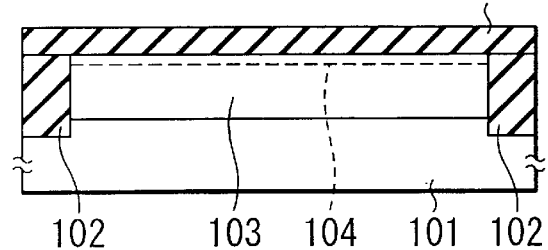
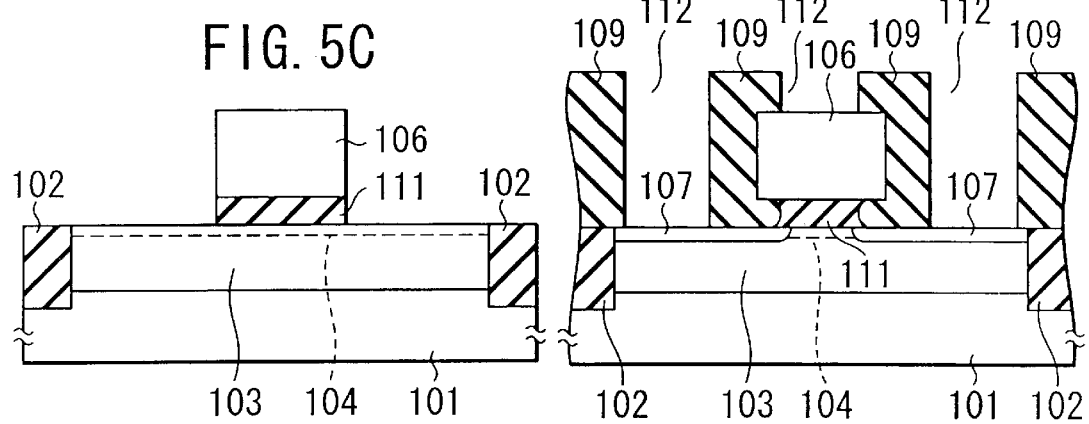
FIG. 5A
FIG. 5B
FIG. 5C
FIG. 5D
FIG. 5E
FIG. 5F
FIG. 5G

FIELD-EFFECT TRANSISTOR WITH MULTIDIELECTRIC CONSTANT GATE INSULATION LAYER

CROSS-REFERENCE TO RELATED APPLICATIONS

This application is based upon and claim the benefit of priority from the prior Japanese Patent Applications No. 11-276259, filed Sep. 29, 1999, the entire contents of which are incorporated herein by reference.

BACKGROUND OF THE INVENTION

The present invention relates generally to a field-effect transistor of a MOS structure (including a MIS structure), and more particular to a field-effect transistor with an improved gate insulation film and a method of fabricating the same.

FIG. 1 is a cross-sectional view showing a device structure of a conventional MOS field-effect transistor. FIG. 1 shows an n-channel type field-effect transistor by way of example. In FIG. 1, reference numeral 1 denotes a p-type silicon substrate; 2 an isolation region; 3 a p-well region; 4 an n-channel, more specifically, a region doped with impurities for controlling a threshold voltage of the field-effect transistor; 5 a gate insulation film of $SiO_2$, etc.; 6 a gate electrode formed of a polysilicon film, etc.; 7 a source/drain region; 8 wiring; and 9 an interlayer insulation film.

In the field-effect transistor with the above structure, the gate insulation film 5 is formed of uniform material over an entire region covered with the gate electrode 6. From the standpoint of enhancement of a current drive power of the device, it is preferable to set a dielectric constant of the gate insulation film 5 at a high value. This, however, increases a capacitance of a overlap portion where the gate electrode 6 overlaps the sour/drain region 7. The increase in capacitance of the overlap portion means an increase in parasitic capacitance of the device, and it increases a delay time of the device. That is, the operation speed of the device decreases. This problem is serious, in particular, in the case of a CMOS inverter in which a mirror capacitance is present at a portion of a pMOS which is opposite to a power supply and at a portion of an nMOS which is opposite to a ground.

The capacitance of the overlap portion between the gate electrode 6 and the source/drain region 7 may be decreased if the gate insulation film is formed of a material with a low dielectric constant. Where the gate insulation film is formed of such a low dielectric-constant material, however, the current drive power of the device decreases and in this case, too, the operation speed of the device decreases. Moreover, that the gate insulation film is formed of a low dielectric-constant material means a decrease in controllability of the gate electrode 6, with which the gate electrode 6 controls a charge in the channel region. This poses a further problem that a short channel effect increases.

As has been described above, from the standpoint of reduction in capacitance between the gate electrode and the source/drain region, it is preferable that the dielectric constant of the gate insulation film be low. However, from the standpoint of suppression of the short channel effect and enhancement of the current drive power of the device, it is preferable that the capacitance between the gate and the channel region be large and, accordingly, that the dielectric constant of the gate insulation film be high. Under the circumstances, in the conventional device, it is not possible to sufficiently suppress the short channel effect and obtain an adequate current drive power, and at the same time to sufficiently reduce the parasitic capacitance in the device. This has prevented realization of a higher-speed operation of the device.

BRIEF SUMMARY OF THE INVENTION

The object of the present invention is to provide a field-effect transistor which can have a high current drive power and a sufficient suppression function for a short channel effect, while suppressing a parasitic capacitance and achieving a high-speed operation.

In order to achieve the object, according to a first aspect of the present invention, there is provided a field-effect transistor comprising:

a semiconductor substrate;

a gate insulation film formed selectively on the semiconductor substrate;

a gate electrode formed on the gate insulation film;

source/drain regions formed in surface portions of the semiconductor substrate along mutually opposed side surfaces of the gate electrode, the source/drain regions having opposed end portions located immediately below the gate electrode, each of the opposed end portions having an overlapping region which overlaps the gate electrode; and a channel region formed in a surface portion of the semiconductor substrate, which is sandwiched between the opposed source/drain regions, wherein that portion of the gate insulation film, which is located at the overlapping region where at least one of the source/drain regions overlaps the gate electrode, has a lower dielectric constant than that portion of the gate insulation film, which is located on the channel region.

According to a second aspect of the invention, there is provided a field-effect transistor comprising:

a semiconductor substrate;

a gate electrode formed above the semiconductor substrate;

a gate insulation film formed between the gate electrode and the semiconductor substrate, the gate insulation film retreating from at least one of mutually opposed ends of the gate electrode;

an interlayer insulation film formed on at least one of mutually opposed side surfaces of the gate electrode, that portion of the interlayer insulation film, which is located on a side where the gate insulation film retreats, being put in contact with the semiconductor substrate, and a void being created by the gate electrode, the gate insulation film and the substrate; and source/drain regions formed in surface portions of the semiconductor substrate along the mutually opposed side surfaces of the gate electrode, the source/drain regions having opposed end portions located immediately below the gate electrode, each of the opposed end portions having an overlapping region which overlaps the gate electrode.

According to a third aspect of the invention, there is provided a method of fabricating a field-effect transistor, the method comprising the steps of:

forming a gate electrode over a semiconductor substrate, with a gate insulation film interposed therebetween;

forming source/drain regions in surface portions of the semiconductor substrate in a self-alignment manner with the gate electrode;

removing a portion of the gate insulation film from at least one side of the gate insulation film; and forming a gate insulation region, which has a lower dielectric constant than the gate insulation film, at a region from which the portion of the gate insulation film is removed.

According to a fourth aspect of the invention, there is provided a method of fabricating a field-effect transistor, the method comprising the steps of:

forming a gate electrode over a semiconductor substrate, with a gate insulation film interposed therebetween;

forming a conductor film selectively on a side surface of the gate electrode;

forming source/drain regions in surface portions of the semiconductor substrate in a self-alignment manner with the gate electrode including the conductor film; and a step of forming a gate insulation region, which has a lower dielectric constant than the gate insulation film, at a region between the conductor film and the substrate.

In the present invention, it is preferable that the dielectric constant of the gate insulation film on the channel region be set to be higher than that of a commonly used silicon oxide film. Examples of such a gate insulation film are a titanium oxide film, a silicon nitride film, a silicon oxynitride film, a tantalum pentoxide film, zirconium oxide film, hafnium oxide film, lanthanum oxide film, aluminum oxide film yttrium oxide film, scandium oxide film and a layered/mixed film of the foregoings. If the gate insulation film with such a high dielectric constant is used, the short channel effect can be effectively suppressed and the high current drivability can be realized. In addition, in the present invention, the dielectric constant of the gate insulation film on the source region and drain region is set to be lower than that of the gate insulation film on the channel region. Therefore, the parasitic capacitance is also reduced. As a result, the short channel effect can be effectively suppressed and the high-speed operation can be realized.

In addition, by creating a void in the gate insulation film on the source region or drain region, the capacitance between the source/drain region and the gate electrode can be further reduced. As a result, the short channel effect can be more effectively suppressed and the high-speed operation can be realized more effectively.

A description will now be given of the advantageous effect by which an increase in parasitic capacitance can be suppressed also by using the high-dielectric constant film as in the present invention.

FIG. 2 is a graph showing the dependency of the parasitic capacitance per unit width (a value obtained by subtracting the gate capacitance (created between the gate and channel) from the total load capacitance) upon the dielectric constant of the gate insulation film in the structure of the present invention and the prior-art structure. A curve marked by ○ indicates a dielectric constant in a case where the insulation film under the gate is uniform (FIG. 3A), and a curve marked by Δ indicates a case where the dielectric constant of the insulation film under the gate is high only on the channel, and the dielectric constant on the source/drain is 3.9 (FIG. 3B). In either case, the abscissa indicates the dielectric constant of the gate insulation film on the channel and the ordinate indicates the parasitic capacitance per unit gate width.

In FIGS. 3A and 3B, the parameters of the devices are set as follows:

the gate length=50 nm the length of overlapping portion between the gate and the source/drain=7 nm the thickness of the gate insulation film=1.5 nm×the dielectric constant of the high-dielectric constant film/3.9 the impurity concentration of the well=1×10$^{18}$ cm$^{-3}$.

FIG. 2 shows that the parasitic capacitance indicated by Δ is decreased about 30% to 40%, compared to that indicated by ○. In the devices according to these examples, the gate capacitance is about 1 fF/μm, and the total load capacitance in the case indicated by Δ is decreased about 10% to 20%, compared to the case indicated by ○. Taking into account the fact that the delay time is proportional to the load capacitance, the delay time in the structure shown in FIG. 3B decreases by about 10% to 20%, compared to the structure shown in FIG. 3A. In other words, a higher-speed operation can be performed with the structure according to the case indicated by Δ.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A to 5G are cross-sectional views showing steps of a process of fabricating the FET according to the first embodiment;

DETAILED DESCRIPTION OF THE INVENTION

First Embodiment

Figure 1:
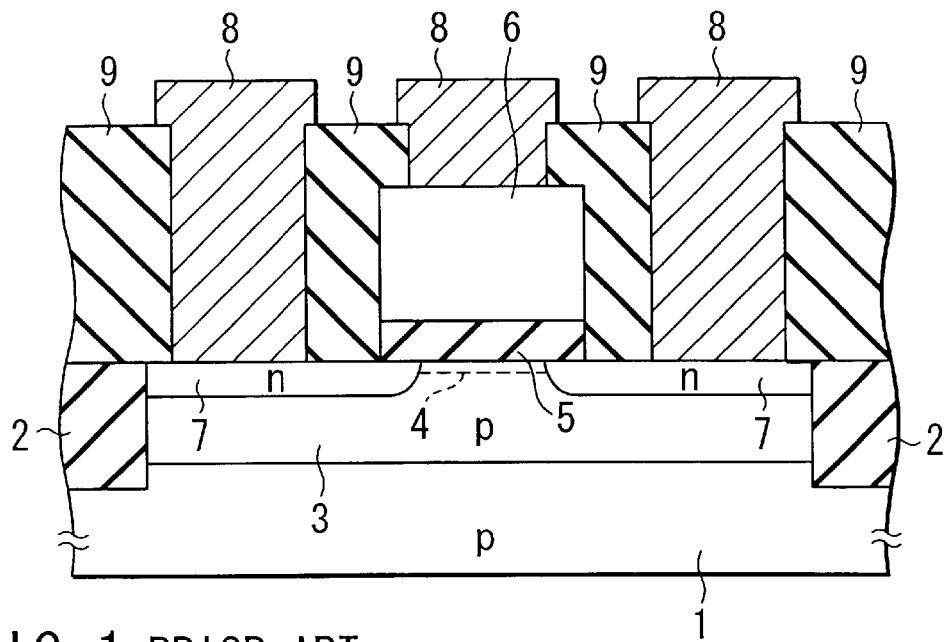
FIG. 1 is a cross-sectional view showing a device structure of a conventional MOS field-effect transistor (FET)
Figure 2:
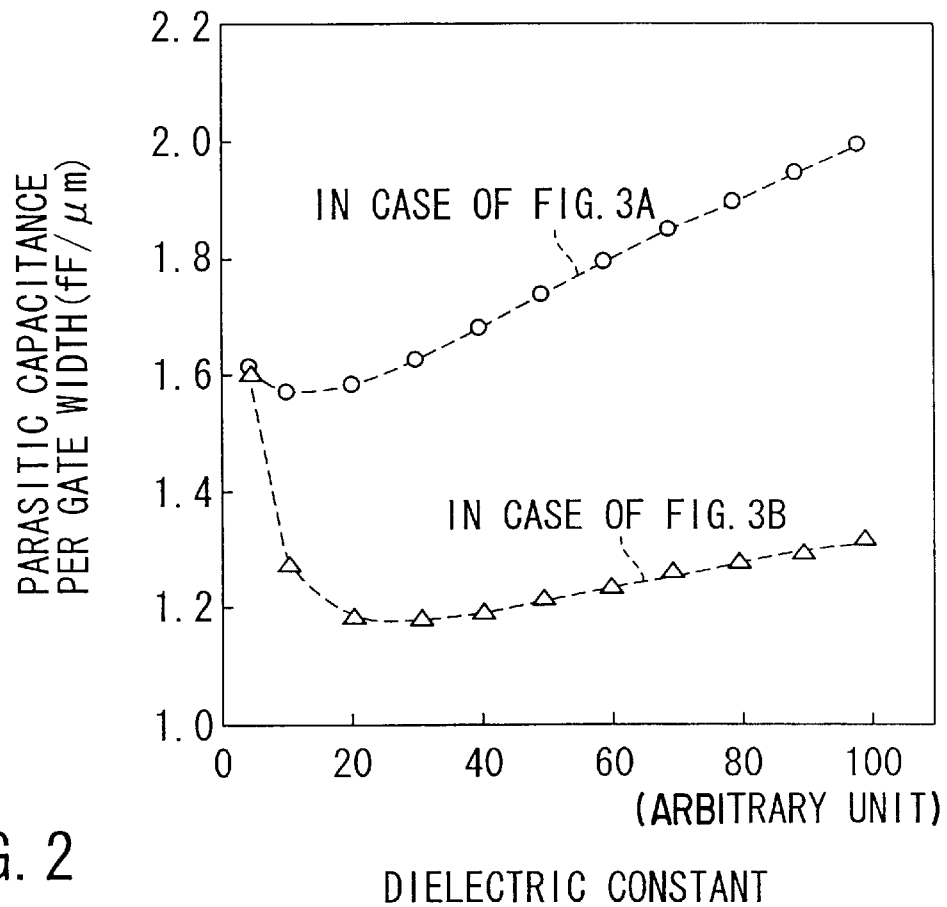
FIG. 2 is a graph showing the dependency of a parasitic capacitance per unit width upon the dielectric constant of a gate insulation film, with comparison between the present invention and prior art.
Figure 3A:
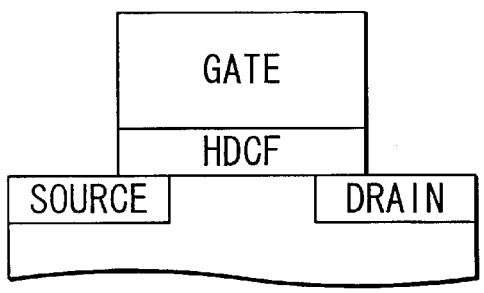
FIG. 3A is a diagram showing a device structure of the prior art in FIG. 2.
Figure 3B:
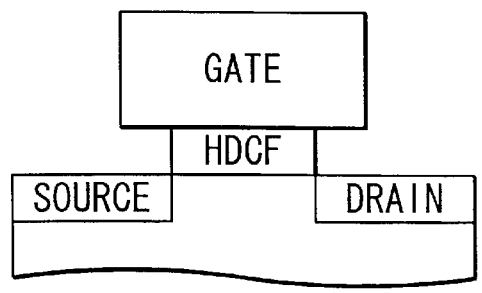
FIG. 3B is a diagram showing a device structure of the present invention in FIG. 2.
Figure 4:
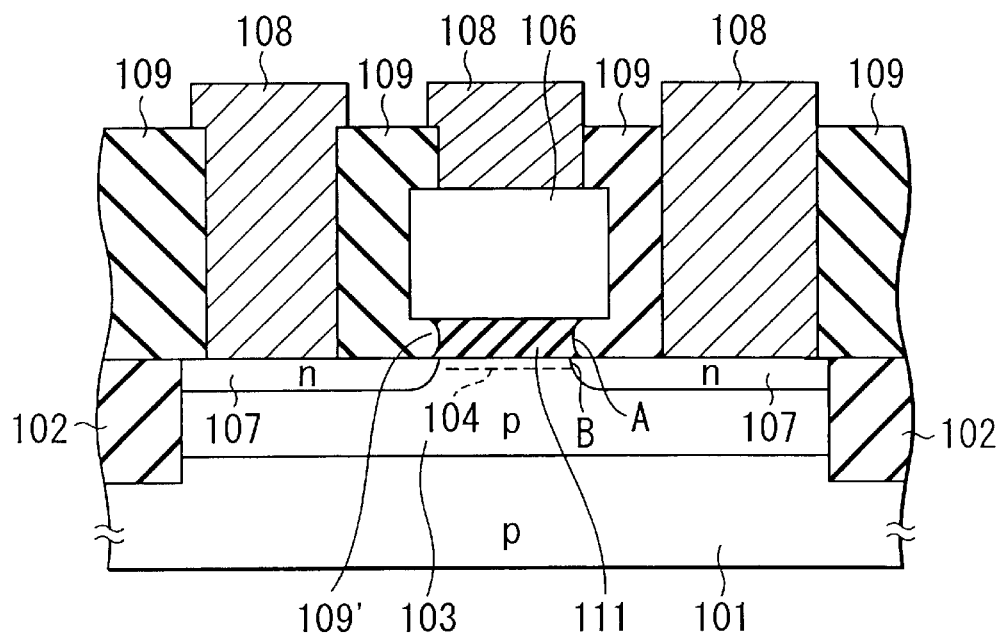
FIG. 4 is a cross-sectional view showing a device structure of a MOSFET according to a first embodiment of the present invention.

FIG. 4 is a cross-sectional view showing a device structure of a MOS field-effect transistor (FET) according to a first embodiment of the present invention.

In the first embodiment, an n-channel MOSFET will be described by way of example. If the conductivity types of impurities are reversed, all the description of the n-channel MOSFET is applicable to a p-channel MOSFET. In addition, if a method of implanting impurities only in specified regions in the substrate using a process such as photolithography is adopted, the same advantageous effect can be obtained with a complementary field-effect transistor.

Isolation regions 102 are formed on a p-type silicon substrate 101 by a trench isolation method. A p-well region 103 is so formed as to be surrounded by the isolation regions 102. An n-channel (an impurity-implanted region for controlling a threshold voltage of the FET) 104 is formed in a surface portion of the p-well region 103. A first gate insulation film 111 of $TiO_2$, etc. is formed on the channel region 104. A gate electrode 106 of polycrystalline silicon is formed on the first gate insulation film 111. Source/drain regions 107 are formed in a surface portion of the p-well region 103 so as to sandwich the channel region 104. The gate electrode 106 is formed such that it may partially overlap the source/drain region 107. The gate insulation film 111 is partially removed at a location between the source/drain region 107 and gate electrode 106.

An interlayer insulation film 109 is formed on the resultant structure. The interlayer insulation film 109 is filled even in the partially removed portion of the gate insulation film 111 between the gate electrode 106 and source/drain region 107. That portion of the interlayer insulation film 109, which is filled in the partially removed portion of the gate insulation film 111, constitutes a second gate insulation film 109'. Contact holes for connection between the source/drain regions 107 and gate electrode 106, on the one hand, and wiring, on the other, are provided in the interlayer insulation film 109. wiring 108 is formed on the interlayer insulation film 109 so as to fill each contact hole.

The FET according to the first embodiment is characterized in that the dielectric constant of the gate insulation film varies between a portion thereof on the channel region 104 and a portion thereof on the source/drain region 107. Specifically, the dielectric constant of the gage insulation film (first gate insulation film 111) is high in its portion on the channel region 104, and so high controllability of the gate electrode 106, with which the gate electrode 106 controls the charge in the channel region 104, is maintained. Accordingly, the short channel effect can be sufficiently suppressed, and high current drivability is obtained. On the other hand, the dielectric constant of the gage insulation film (second gate insulation film 109') is low in its portion on the source/drain region 107, and so the capacitance created between the source/drain region 107 and gate electrode 106 is limited at low level and the parasitic capacitance is reduced.

A method of fabricating the field-effect transistor according the first embodiment will now be described.

As is shown in FIG. 5A, isolation regions 102 are formed on a p-type silicon substrate 101 by a trench isolation method. For example, B ions are implanted in a p-well formation region under conditions of 100 keV and $2.0 \times 10^{13}$ $cm^{-2}$, following which a heat treatment is performed at 1050° C. for 30 seconds. Thus, a p-well region 103 is formed.

Then, as shown in FIG. 5B, for example, B ions are implanted in the p-well region 103 under conditions of 30 keV and $1.0 \times 10^{13}$ $cm^{-2}$ in order to obtain a desired threshold voltage. Thus, the impurity concentration of a near-surface portion of a channel region 104 is controlled.

In a subsequent step illustrated in FIG. 5C, a $TiO_2$ film 111 with a thickness of 15 nm, which will become a first gate insulation film, is formed by a process such as CVD (chemical vapor deposition).

In FIG. 5D, a polysilicon film 200 nm thick is deposited on the $TiO_2$ film 111 by LPCVD (low-pressure chemical vapor deposition). The polysilicon film is etched by an anisotropic etching process such as RIE (reactive ion etching), thus forming a gate electrode 106. The $TiO_2$ film 111, too, is subjected to anisotropic etching.

In the next step illustrated in FIG. 5E, for example, As ions are implanted under conditions of 50 kev and $5.0 \times 10^{15}$ $cm^{-2}$, and the resultant structure is subjected to heat treatment. Thus, source/drain regions 107 are formed.

In FIG. 5F, the $TiO_2$ film 111 is subjected to isotropic etching such as CDE chemical dry etching so that a portion of the $TiO_2$ film 111, which lies on the source/drain region 107, may be removed.

Next, as shown in FIG. 5G, a silicon oxide film 109 with a thickness of 500 nm serving as an interlayer insulation film, is deposited by CVD, and contact holes 112 are formed by RIE on the source/drain regions 107 and gate electrode 106. In this step, the silicon oxide film 109 is made to fill the space created by the removal of the portion of the $TiO_2$ film 111.

Subsequently, an Al film 300 nm thick containing 1% of, e.g. Si is formed over the entire surface of the silicon substrate 101 by a process such as sputtering. The Al film is subjected to anisotropic etching such as RIE, and wiring 108 is formed. Thus, a filed-effect transistor having the structure as shown in FIG. 4 is fabricated.

The present invention is also applicable to cases where field-effect transistors are formed as part of semiconductor devices which include active devices such as bipolar transistors or single-electron transistors, or passive devices such as resistors, diodes, inductors or capacitors, in addition to field-effect transistors. Moreover, this invention is similarly applicable to SOI (silicon on insulator) devices.

In the first embodiment, As is used as impurities for forming the n-type semiconductor layer and B (boron) is used as impurities for forming the p-type semiconductor layer. It is possible, however, to use another Group V element as impurities for forming the n-type semiconductor layer and another Group III element as impurities for forming the p-type semiconductor layer. Besides, Group III impurities and Group V impurities may be introduced in the form of compounds containing them.

In the first embodiment, impurities are introduced by ion implantation. However, impurities may be introduced by other processes such as solid phase diffusion or vapor phase diffusion. In addition, a semiconductor containing impurities may be deposited or grown.

In the first embodiment, the device has the single drain structure. However, the device may have some other structure such as an LDD (lightly doped drain) or GDD (graded diffused drain) structure. Moreover, the device may have a pocket structure or an elevated source structure.

In the first embodiment, impurities are introduced in the source/drain regions 7 prior to the formation of the gate electrode 106 or gate insulation film 109'. However, the order of these steps is not essential and it may be reversed.

In the first embodiment, a silicide structure is not mentioned. It is possible, however, to adopt a silicide structure for the source/drain region 107 or gate electrode 106. Besides, it is possible to adopt of method of depositing or growing a metal layer on the source/drain regions 107.

In the first embodiment, the metal layer for wiring is formed by sputtering. The metal layer, however, may be formed by another method such as a deposition method. Furthermore, a method such as selective growth of metal may be adopted.

In the first embodiment, introduction of impurities in the gate electrode 106 is performed at the same time as the implantation of impurities for forming the source/drain. However, the impurities may be introduced in the gate electrode 106 in a step different from the step of introducing impurities for forming the source/drain. The method of introducing impurities in the gate electrode 106 is not limited to the ion implantation adopted in the first embodiment. It is also possible to introduce impurities by solid phase diffusion or vapor phase diffusion, or to form a silicon film containing impurities.

In the first embodiment, polysilicon is used for the gate electrode 106. However, the gate electrode 106 may be formed of single-crystal silicon, amorphous silicon, a metal, a metal-containing compound, or a lamination thereof. Although an upper part of the gate electrode 106 has such a structure that polysilicon is exposed, an insulator such as silicon oxide or silicon nitride may be provided on the upper part.

In the first embodiment, the gate electrode 106 is formed by anisotropic etching after the gate electrode material is deposited. However, the gate electrode 106 may be formed by using a burying process such as a damascene process.

In the first embodiment, the $TiO_2$ film formed by deposition is used as the first gate insulation film 111. However, another insulator film such as a nitride film, an oxynitride film, or a lamination film may be used. Moreover, some other high-dielectric constant film such as $Ta_2O_5$ may be used as the gate insulation film 111. It should be noted, however, that the essential reason why advantageous effect of the method of the present invention can be obtained is that the gate insulation film has a dielectric constant which varies from location to location. Therefore, the advantageous effect of the invention cannot fully be obtained if a region in the gate insulation film, which should have a high dielectric constant, is formed of a material with not so high a dielectric constant such as silicon oxide widely used in conventional gate insulation films. Therefore, the advantageous effect of the invention is conspicuous where a region in the gate insulation film, which should have a high dielectric constant, is formed of a material having a higher dielectric constant than silicon oxide.

The method of forming the gate insulation film is not limited to deposition. The gate insulation film may be formed by some other method such as sputtering. Moreover, where the gate insulation film is formed of an oxide of some substance, a film of the substance may first be formed and then the film may be oxidized. Furthermore, a device using a ferroelectric film as the gate insulation film may be fabricated.

In the first embodiment, the isotropic etching on the gate insulation film is carried out by the vapor phase reaction. However, the isotropic etching may be carried out, for example, by dipping the gate insulation film in a chemical liquid.

In the first embodiment, no side wall insulator is formed on the gate electrode. However, a side wall insulator may be provided on the gate electrode. In the first embodiment, the isolation of the device is effected by the trench isolation method. The isolation, however, may be performed by some other method such as local oxidation or mesa isolation.

In the first embodiment, post-oxidation is not performed after the formation of the gate electrode. However, such post-oxidation may be carried out. In addition, in the first embodiment, the silicon oxide film is used as the interlayer insulation film 109. However, a material such as a low dielectric-constant material, other than silicon oxide, may be used for the interlayer insulation film. Where the interlayer insulation film 109 and gate side wall insulator are formed of different materials, a self-alignment contact may be formed. In the first embodiment, the semiconductor device with single-layer wiring 108 is described. However, two or more layers of elements or wiring may be adopted.

Figure 6:
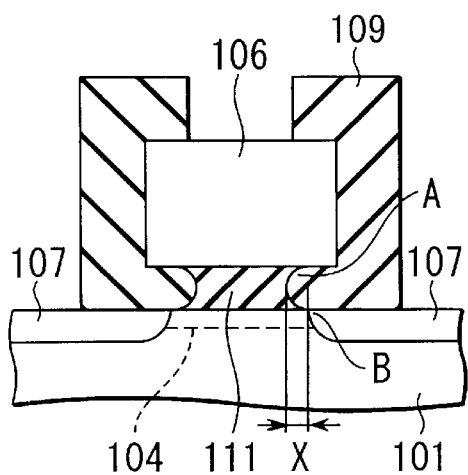
FIGS. 6 to 10 are cross-sectional views of regions including gate electrodes, showing various modes of the gate insulation film of the FET according to the first embodiment.
Figure 7:
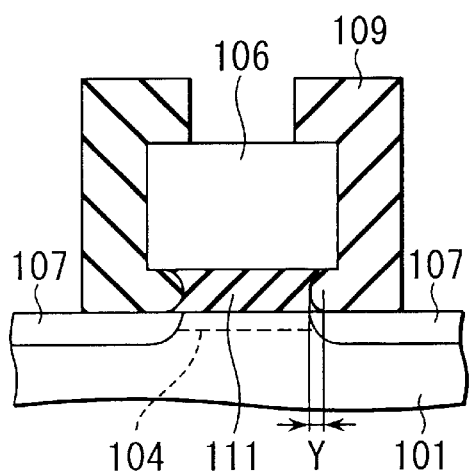

In the first embodiment, a boundary (indicated by A in FIG. 4) between the $TiO_2$ film (high-dielectric constant film) 111 and $SiO_2$ film (low dielectric-constant film) 109' under the gate electrode substantially coincides in position with an end of the source/drain region 107. This positional relationship, however, is not essential. For example, as shown in FIG. 6, the boundary A may be shifted toward the center of the channel, compared to FIG. 4. Alternatively, as shown in FIG. 7, the boundary A may be shifted away from the center of the channel, compared to FIG. 4. However, if a region (indicated by X in FIG. 6) including a low dielectric-constant material in a range from just above the substrate to just below the gate electrode 106 is present in the gate insulation film over the channel region 104, a local threshold voltage increases in this region and the current drivability of the device decreases. It is preferable, therefore, that the gate insulation film at a given point over the channel region 104 be formed of a high-dielectric constant material at least at one location in a range from just above the substrate to just below the gate electrode 106.

In particular, in the case of a so-called high-dielectric constant gate insulator device wherein the gate insulation film is formed of a material having a higher dielectric constant than silicon oxide, the thickness of the gate insulation film is large. If the gate insulation film over the source/drain region 107 is all formed of a low-dielectric constant material, it is considered that substantially no overlapping is present between the gate electrode 106 and source/drain region 107. It is known that, in this case, too, the current drivability of the device decreases. Therefore, it is preferable that a region (indicated by Y in FIG. 7) formed of a high-dielectric constant material be present in the gate insulation film over the source/drain region 107.

In the high-dielectric constant gate insulator device, the distance between the gate electrode and the substrate is increased in order to prevent an increase in gate capacitance. Thus, the distribution of lines of electric force is not always vertical to the surface of the substrate. As a result, even where the region X shown in FIG. 6 in which the gate insulation film is formed of the low-dielectric constant material is present on the channel region, the current drivability of the transistor is very low. It is preferable, therefore, that when the present invention is applied, the high-dielectric constant region of the gate insulation film be formed of a material having a higher dielectric constant than silicon oxide.

In the first embodiment, the gate insulation film is formed of the low-dielectric constant all over from just above the substrate to just below the gate electrode 106, at least at a portion of the region where the source/drain region 107 overlaps the gate electrode 106. This structural feature, however, is not essential. When the high-dielectric constant gate insulation film 111 is subjected to isotropic etching, the high-dielectric constant gate insulation film 111 may remain at a substrate-side portion or a gate-side portion above the source/drain region.

Figure 8:
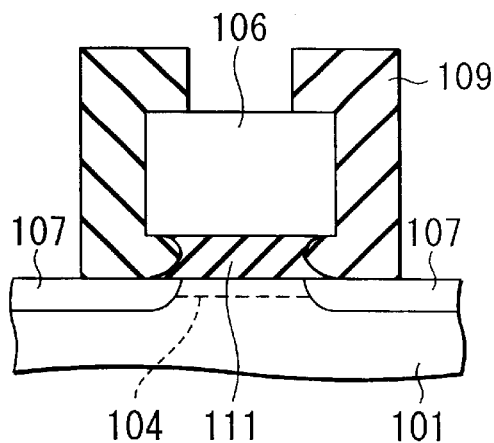
Figure 9:
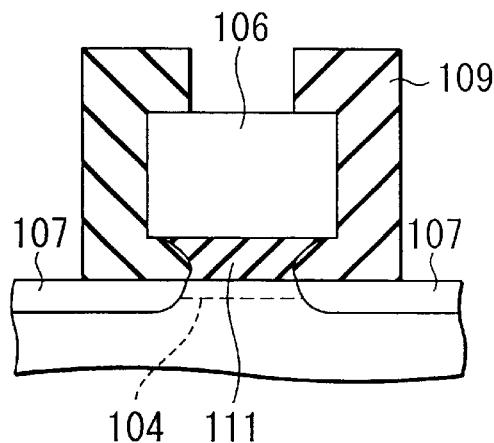
Figure 10:
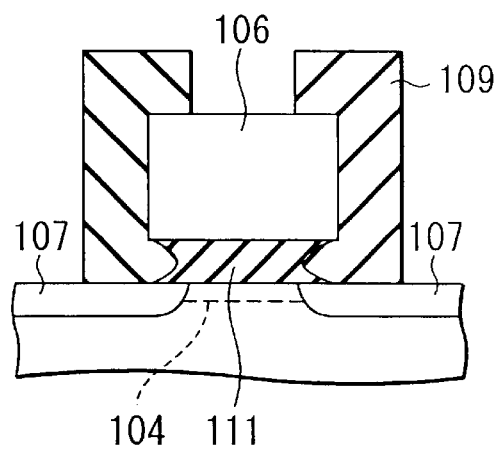

Specifically, as is shown in FIG. 8, the high-dielectric constant gate insulation film 111 may be formed in a tailing fashion so that the uppermost portion of the substrate may be covered with the high-dielectric constant material. Similarly, as is shown in FIG. 9, the high-dielectric constant gate insulation film 111 may be formed in a tailing fashion so that the lowermost portion of the gate electrode 106 may be covered with the high-dielectric constant material. Moreover, as is shown in FIG. 10, the high-dielectric constant gate insulation film 111 may be formed in a tailing fashion so that both the uppermost portion of the substrate and the lowermost portion of the gate electrode 106 may be covered with the high-dielectric constant material. In order to suppress the capacitance created between the source/drain region 107 and the gate electrode 106, however, it is preferable that the gate insulation film be formed of the low-dielectric constant all over from just above the substrate to just below the gate electrode 106, at least at a portion over the source/drain region 107.

Each of FIGS. 6 to 10 shows the structure of a single transistor alone. However, needless to say, the structure of the above-described gate insulation film may be modified to cover cases where a plurality of transistors are formed, and the same advantageous effect can be obtained.

Second Embodiment

Figure 11A:
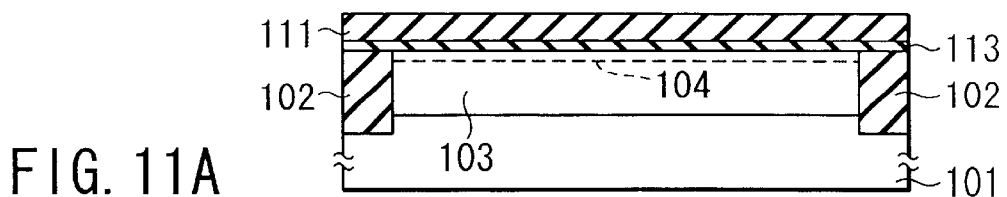
FIGS. 11A to 11E are cross-sectional views showing steps of a process of fabricating a field-effect transistor according to a second embodiment of the invention.

A MOS field-effect transistor according to a second embodiment of the present invention will now be described with reference to FIGS. 11A to 11D. In the second embodiment, as shown in FIG. 11A, the surface of the substrate is oxidized in an oxygen atmosphere at 700° C., following the step of FIG. 5B in the first embodiment. Thereby, a silicon oxide film 113 with a thickness of 1 nm is formed. Then, using a process such as CVD, a $TiO_2$ film 111 with a thickness of 15 nm is formed.

Figure 11B:
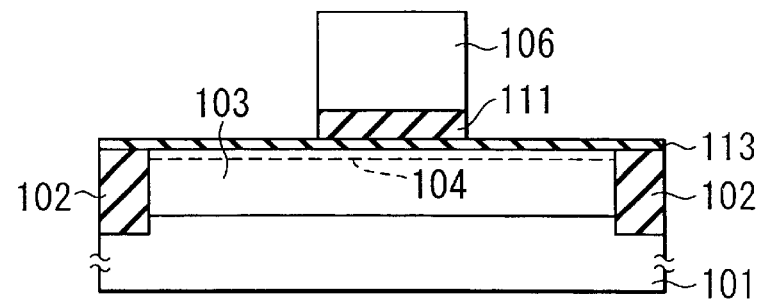

Subsequently, as shown in FIG. 11B, a polysilicon film with a thickness of 200 nm is deposited by LPCVD on the $TiO_2$ film 111. The polysilicon film is processed by anisotropic etching such as RIE and a gate electrode 106 is formed. Further, the $TiO_2$ film 111, too, is processed by anisotropic etching.

Figure 11C:
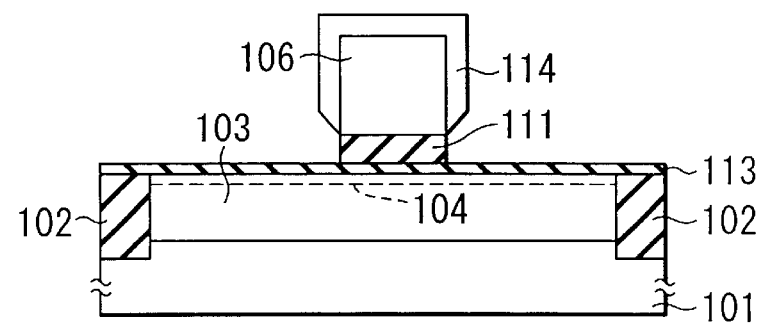

As is shown in FIG. 11C, using a process such as epitaxial growth, a silicon layer 114 is formed on a periphery of the gate electrode 106. In this case, since the silicon oxide film 113 is provided on the surface of the substrate, no silicon layer grows on the surface of the substrate and the silicon layer 114 can be selectively grown on the periphery of the gate electrode 106 alone.

Figure 11D:
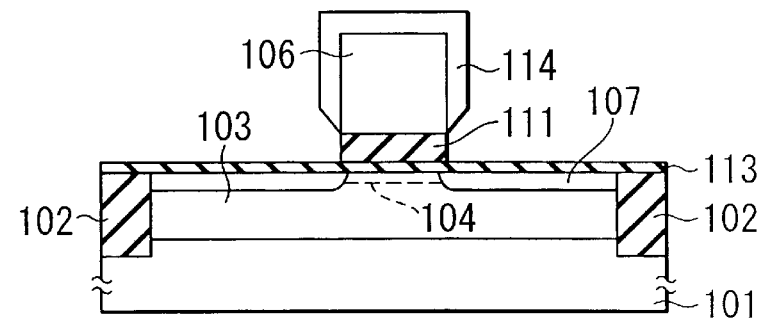

As is shown in FIG. 11D, for example, As ions are implanted under conditions of 100 keV and $5.0\times10^{15}$ $cm^{-2}$.

The resultant structure is subjected to a heat treatment and source/drain regions 107 are formed.

Figure 11E:
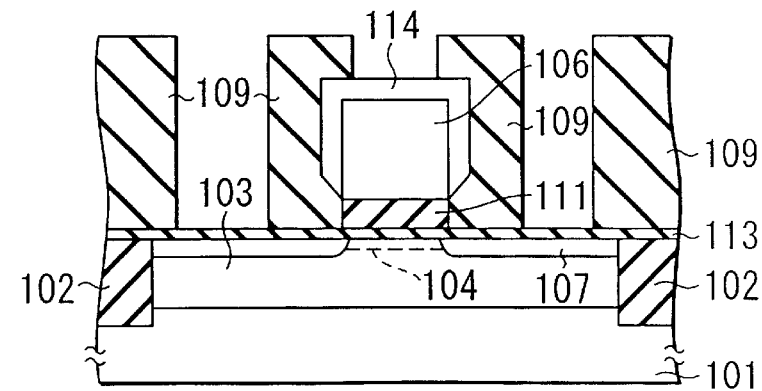

Then, as shown in FIG. 11E, a silicon oxide film 109 with a thickness of 500 nm is deposited by CVD as an interlayer insulation film, following which contact holes 112 are opened by RIE on the source/drain regions 107 and gate electrode 106. At this time, the silicon oxide film 109 is made to fully extend under the silicon layer 114. The subsequent steps are common to those in the first embodiment.

In the second embodiment, too, such various modifications as have been described in connection with the first embodiment can be made, and the same advantageous effects can be obtained. In the second embodiment, the silicon layer 114 adjoining the gate electrode 106 is formed under the condition that facets are created. However, the silicon layer 114 may be formed such that no facets are created. In the case where the silicon layer 114 is formed under the condition that facets are created, the capacitance between the source/drain regions 107 and gate electrode 106 is made lower than in the case where no facets are created. Accordingly, it is more effective to form the silicon layer 114 under the condition that facets are created.

In the second embodiment, the gate electrode 106 is formed of a semiconductor and after it is processed, a semiconductor layer is formed to adjoin the gate electrode 106. However, there is no need to form both of them of semiconductors, and these may be formed of combinations of a semiconductor, a metal, a metal silicide, etc.

In the second embodiment, when the gate insulation film of the laminated structure is formed, the insulation film 113 provided immediately above the substrate is formed of a silicon oxide film. However, the insulation film 113 may be formed of some other kind of film, for instance, a silicon nitride film, an oxynitride film, or some other laminated insulation film. The method of forming the insulation film 113 provided immediately above the substrate is not limited to thermal oxidation, and it may be formed by a process such as deposition.

Third Embodiment

A MOS field-effect transistor according to a third embodiment of the present invention will now be described with reference to FIGS. 12A and 12B.

Figure 12A:
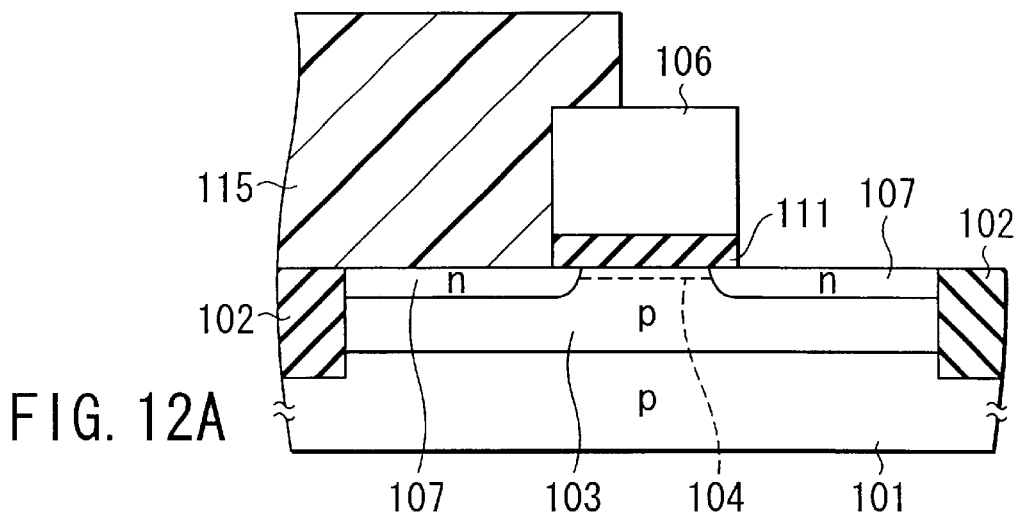
FIGS. 12A and 12B are cross-sectional views showing steps of a process of fabricating a field-effect transistor according to a third embodiment of the invention.

In the third embodiment, as is shown in FIG. 12A, a resist film 115 is formed on the substrate, following the step of FIG. 5E in the first embodiment. Part of the resist film 115 is selectively removed by a process such as photolithography.

Figure 12B:
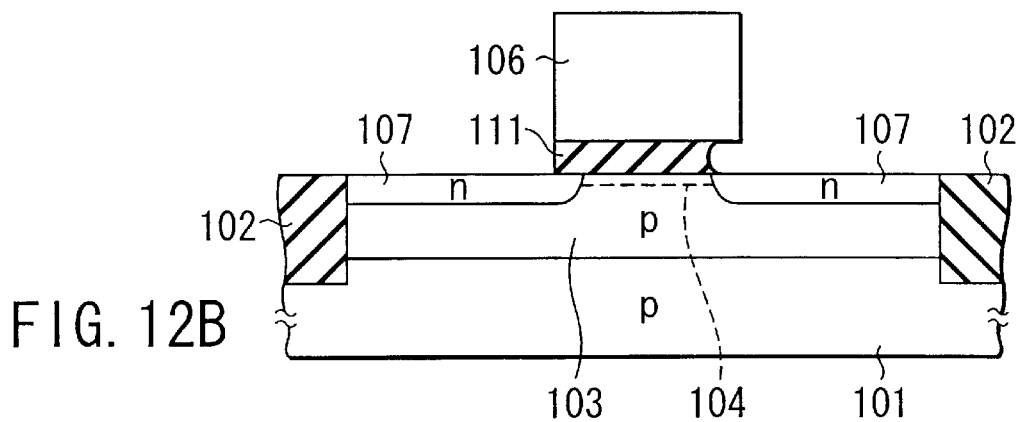

Subsequently, as shown in FIG. 12B, the $TiO_2$ film 111 is subjected to isotropic etching such as CDE, and part of the $TiO_2$ film 111 on one of the source/drain regions 107 is removed. Thereafter, the resist film 115 is removed. The subsequent steps are common to the steps from the step of FIG. 5G in the first embodiment.

In the third embodiment, too, the dielectric constant of the gate insulation film between the gate electrode and source/drain can be lowered. In addition, such various modifications of the structure of the gate insulation film as have been described in connection with the first embodiment can be made, and the same advantageous effects can be obtained.

Fourth Embodiment

A MOS field-effect transistor according to a fourth embodiment of the present invention will now be described with reference to FIG. 13.

Figure 13:
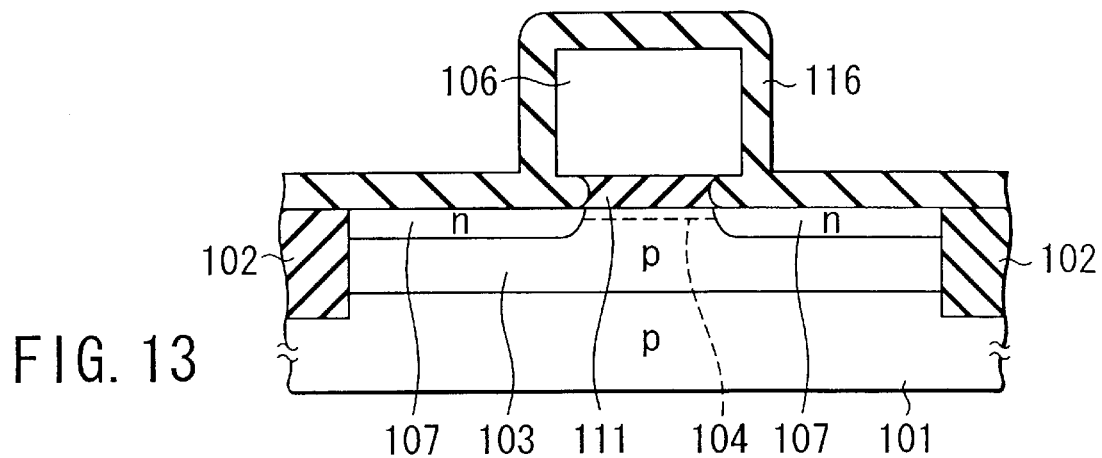
FIG. 13 is a cross-sectional view illustrating a process of fabricating a field-effect transistor according to a fourth embodiment of the invention.

In the fourth embodiment, as is shown in FIG. 13, a silicon oxide film (second gate insulation film) 116 is formed over the entire surface of the semiconductor substrate by a process such as CVD, following the step of FIG. 5F in the first embodiment. The subsequent steps are common to the steps from the step of FIG. 5G in the first embodiment.

In the fourth embodiment, too, such various modifications of the structure of the gate insulation film as have been described in connection with the first embodiment can be made, and the same advantageous effects can be obtained.

In the fourth embodiment, silicon oxide is used as the insulator 116 which is filled in the region from which part of the insulation film under the gate electrode 106 has been removed. Even where the insulator 116 is not silicon oxide and is silicon nitride, silicon oxynitride or insulator containing F (fluorine) or C (carbon), the same advantageous effect can be obtained if the dielectric constant thereof is lower than that of the gate insulation film formed on the channel region.

The method of forming the insulation layer is not limited to deposition, and it may be sputtering, oxidation or nitriding. It should be noted, however, that if such a method as oxidizing the substrate, which consumes the silicon of the substrate, is adopted, the source/drain region is thinned and the resistance increases. Therefore, it is preferable to use a method such as deposition, which does not consume the silicon of the substrate.

In the fourth embodiment, after part of the gate insulation film 111 under the gate electrode 106 is removed, the insulator 116 is formed to fill the removed portion of the gate insulation film and then the interlayer insulation film 109 is formed. However, after part of the insulator 116 formed on the source/drain region 107 under the gate electrode 106 is removed, the interlayer insulation film 109 may be formed to fill the removed portion of the insulator 116.

In the fourth embodiment, the insulator 116 formed after part of the insulation film under the gate electrode 106 is removed has the same thickness as the first gate insulation film 111. However, the thickness is not essential, and the thickness of the insulator 116 may be made thicker or thinner than the gate insulation film 111.

Fifth Embodiment

A MOS field-effect transistor according to a fifth embodiment of the present invention will now be described with reference to FIG. 14.

Figure 14:
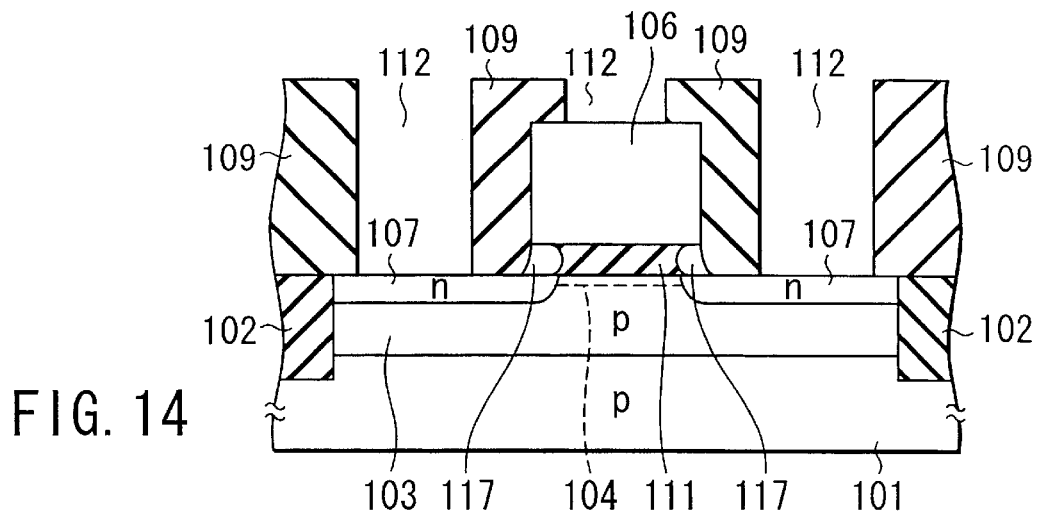
FIG. 14 is a cross-sectional view illustrating a process of fabricating a field-effect transistor according to a fifth embodiment of the invention.

In the fifth embodiment, as is shown in FIG. 14, a silicon oxide film 109 with a thickness of 500 nm serving as an interlayer insulation film is deposited by CVD, following the step of FIG. 5F in the first embodiment. In this case, however, the silicon oxide film 109 is formed under the condition that the coverage is different from that in the first embodiment, so that voids 117 may form at or near the region from which the portion of the TiO$_2$ film 111 has been removed. Then, contact holes 112 are formed by RIE on the source/drain regions 107 and gate electrode 106. The subsequent steps are common to the steps in the first embodiment.

In the fifth embodiment, the voids 117 function as the second gate insulation film. Since the dielectric constant of the voids 117 is lower than that of silicon oxide, the short channel effect can be suppressed more effectively. In the fifth embodiment, too, such various modifications as have been described in connection with the first embodiment can be made, and the same advantageous effects can be obtained.

Sixth Embodiment

A MOS field-effect transistor according to a sixth embodiment of the present invention will now be described with reference to FIG. 15.

Figure 15:
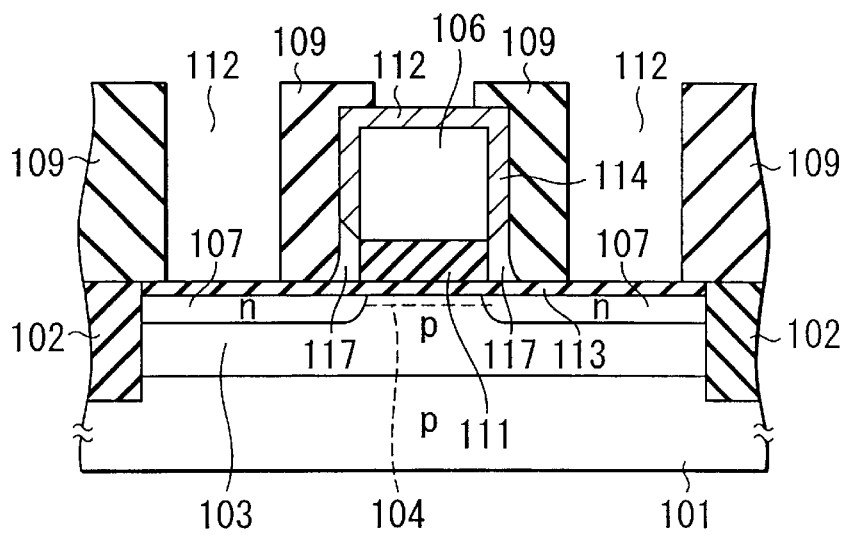
FIG. 15 is a cross-sectional view illustrating a process of fabricating a field-effect transistor according to a sixth embodiment of the invention.

In the sixth embodiment, as is shown in FIG. 15, a silicon oxide film 109 with a thickness of 500 nm serving as an interlayer insulation film is deposited by CVD, following the step of FIG. 11D in the second embodiment. In this case, however, the silicon oxide film 109 is formed under the condition that the coverage is different from that in the first embodiment, so that voids 117 may form at or near the TiO$_2$ film 111. Then, contact holes 112 are formed by RIE on the source/drain regions 107 and gate electrode 106. The subsequent steps are common to the steps in the first embodiment.

In the sixth embodiment, like the fifth embodiment, the voids 117, which have a dielectric constant lower than that of silicon oxide, function as the second gate insulation film. Thus, the short channel effect can be suppressed more effectively. In the sixth embodiment, too, such various modifications as have been described in connection with the first embodiment can be made, and the same advantageous effects can be obtained.

Seventh Embodiment

A MOS field-effect transistor according to a seventh embodiment of the present invention will now be described with reference to FIG. 16.

Figure 16:
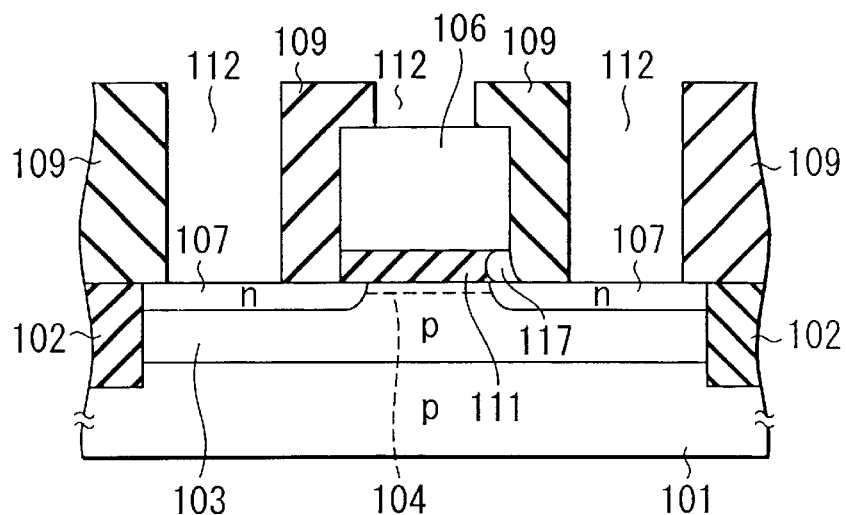
FIG. 16 is a cross-sectional view illustrating a process df fabricating a field-effect transistor according to a seventh embodiment of the invention.

In the seventh embodiment, as is shown in FIG. 16, a silicon oxide film 109 with a thickness of 500 nm serving as an interlayer insulation film is deposited by CVD, following the step of FIG. 12B in the third embodiment. In this case, however, the silicon oxide film 109 is formed under the condition that the coverage is different from that in the first embodiment, so that a void 117 may form at or near the region from which the portion of the TiO$_2$ film 111 has been removed. Then, contact holes 112 are formed by RIE on the source/drain regions 107 and gate electrode 106. The subsequent steps are common to the steps in the first embodiment.

In the seventh embodiment, like the fifth embodiment, the void 117, which has a dielectric constant lower than that of silicon oxide, functions as the second gate insulation film. Thus, the short channel effect can be suppressed more effectively. In the seventh embodiment, too, such various modifications as have been described in connection with the first embodiment can be made, and the same advantageous effects can be obtained.

In the seventh embodiment, no void is created on that side of the gate insulation film, where the resist is applied at the time of subjecting the TiO$_2$ 111 to isotropic etching. However, this is not essential, and the interlayer insulation film may be formed under the condition that voids may form on both sides of the gate insulation film.

As has been described above in detail, in the present invention, the dielectric constant of the gate insulation film in the region where the source/drain region overlaps the gate electrode is made lower than that of the gate insulation film on the channel region. Therefore, the short channel effect can be suppressed and the high current drive power obtained, while the parasitic capacitance can be reduced. As a result, a high-performance semiconductor device wherein the short channel effect is sufficiently suppressed and the high-speed operation is enabled can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A field-effect transistor comprising:

a semiconductor substrate;

a gate insulation film formed selectively on the semiconductor substrate;

a gate electrode layer formed on the gate insulation film;

a source region and a drain region formed in surface portions of the semiconductor substrate along opposed ends of the gate electrode layer, the source region and the drain region having opposed end portions located below the gate electrode layer; and a channel region formed in a surface portion of the semiconductor substrate between opposed end portions of the source region and the drain region, a portion of the gate insulation film on at least one of the opposed end portions having a dielectric constant lower than that of the gate insulation film on the channel region, and the gate insulation film on the channel region being formed of a first material, and the portion of the gate insulating film on at least one of the opposed end portions being formed of a second material having a dielectric constant lower than that of the first material, and the first material containing at least one selected from the group consisting of titanium oxide, tantalum pentoxide, zirconium oxide, hafnium oxide, lanthanum oxide, aluminum oxide, yttrium oxide and scandium oxide.

2. A field-effect transistor according to claim 1, wherein the portion of the gate insulation film on at least one of the opposed end portions of the source region and the drain region has a dielectric constant lower than that of the gate insulation film on the channel region, over an entire region in a film thickness direction of the gate insulation film.

3. A field-effect transistor according to claim 1, wherein the first material forming the gate insulation film on the channel region extends partially from on the channel region to on the source region and the drain region.

4. A field effect transistor comprising:

a semiconductor substrate;

a gate insulation film formed selectively on the semiconductor substrate;

a gate electrode layer formed on the gate insulation film;

a source region and a drain region formed in surface portions of the semiconductor substrate along opposed ends of the gate electrode layer, the source region and the drain region having opposed end portions located below the gate electrode layer; and a channel region formed in a surface portion of the semiconductor substrate between the opposed end portions of the source region and the drain region, the gate insulation film on the channel region being formed of a first film, and a portion of the gate insulating film on at least one of the opposed end portions being formed of a second film having a dielectric constant lower than that of the first film, and the first film containing a mixed film formed of at least two selected from the group consisting of titanium oxide, silicon nitride, silicon oxynitride, tantalum pentoxide, zirconium oxide, hafnium oxide, lanthanum oxide, aluminum oxide, yttrium oxide and scandium oxide.

5. A field-effect transistor comprising:

a semiconductor substrate;

a gate electrode layer formed above the semiconductor substrate;

a gate insulation film formed between the gate electrode layer and the semiconductor substrate, the gate insulation film having a portion drawn back inwardly from at least one of opposed ends of the gate electrode layer, an interlayer insulation film formed on opposed side surfaces of the gate electrode layer and put in contact with the semiconductor substrate, so as to make a void together with the gate electrode layer, the gate insulation film, which is spaced apart from the interlayer insulation film, and the substrate; and a source region and a drain region formed in surface portions of the semiconductor substrate along the opposed ends of the gate electrode layer, the source region and the drain region having opposed end portions located below the gate electrode layer.

6. A field-effect transistor according to claim 5, wherein the void is made at a region between the gate electrode layer and one of the opposed end portions of the source region and the drain region.

7. A field-effect transistor according to claim 5, wherein the gate insulating film contains at least one selected from the group consisting of titanium oxide, tantalum pentoxide, zirconium oxide, hafnium oxide, lanthanum oxide, aluminum oxide, yttrium oxide and scandium oxide.

8. A field-effect transistor according to claim 5, wherein the gate insulation film has a higher dielectric constant than a silicon oxide film.

9. A field-effect transistor comprising:

a semiconductor substrate;

a gate electrode layer formed above the semiconductor substrate;

a gate insulation film formed between the gate electrode layer and the semiconductor substrate, the gate insulation film having a portion drawn back inwardly from at least one of opposed ends of the gate electrode layer, the gate electrode layer having facets at end portions thereof which face the semiconductor substrate;

an interlayer insulation film formed on opposed side surfaces of the gate electrode layer and put in contact with the semiconductor substrate, so as to make a void together with the gate electrode layer, the gate insulation film, which is spaced apart from the interlayer insulation film, and the substrate; and a source region and a drain region formed in surface portions of the semiconductor substrate along the opposed ends of the gate electrode layer, the source region and the drain region having opposed end portions located below the gate electrode layer.

10. A field-effect transistor according to claim 9, wherein said gate insulating film contains at least one selected from the group consisting of titanium oxide, tantalum pentoxide, zirconium oxide, hafnium oxide, lanthanum oxide, aluminum oxide, yttrium oxide and scandium oxide.

11. A field-effect transistor according to claim 9, wherein the gate insulation film has a higher dielectric constant than a silicon oxide film.

12. A method of fabricating a field-effect transistor, the method comprising:

forming a gate electrode layer over a semiconductor substrate, with a gate insulation film interposed therebetween, using, as material of the gate insulation film, at least one selected from the group consisting of titanium oxide, tantalum pentoxide, zirconium oxide, hafnium oxide, lanthanum oxide, aluminum oxide, yttrium oxide and scandium oxide;

forming a source region and a drain region in surface portions of the semiconductor substrate in a self-alignment manner with the gate electrode layer;

removing a portion of the gate insulation film from at least one side of the gate insulation film, using the gate electrode layer as a mask; and forming a gate insulation film region, which has a lower dielectric constant than the gate insulation film, at a region from which the portion of the gate insulation film is removed and along a side surface of the gate electrode layer.

13. A method according to claim 12, wherein the forming of the gate insulation region with a lower dielectric constant than the gate insulation film includes forming, following the removing of the portion of the gate insulation film from at least one side of the gate insulation film, an interlayer insulation film on the semiconductor substrate so as to cover the gate electrode layer, and filling a portion of the interlayer insulation film, as the gate insulation region, in the region from which the portion of the gate insulation film is removed.

14. A method according to claim 12, wherein the forming of the gate insulation region with a lower dielectric constant than the gate insulation film includes forming, following the removing of the portion of the gate insulation film from at least one side of the gate insulation film, an interlayer insulation film on the semiconductor substrate so as to cover the gate electrode layer, the interlayer insulation film forming a void as the gate insulation region at the region from which the portion of the gate insulation film is removed.

15. A method according to claim 12, wherein the removing of the portion of the gate insulation film from at least one side of the gate insulation film includes using isotropic etching.

16. A method of fabricating a field effect transistor comprising:

forming a gate electrode layer over a semiconductor substrate, with a gate insulation film interposed therebetween;

forming a source region and a drain region in surface portions of the semiconductor substrate in a self-alignment manner with the gate electrode layer;

removing a portion of the gate insulation film from at least one side of the gate insulation film; and forming a gate insulation region, which has a lower dielectric constant than the gate insulation film, at a region from which the portion of the gate insulation film is a removed, the gate insulation region containing a mixed film formed of at least two selected from the group consisting of titanium oxide, silicon nitride, silicon oxynitride, tantalum pentoxide, zirconium oxide, hafnium oxide, lanthanum oxide, aluminum oxide, yttrium oxide and scandium oxide.

17. A method of fabricating a field-effect transistor, the method comprising:

forming a gate electrode layer over a semiconductor substrate, with a gate insulation film interposed therebetween;

forming a semiconductor film selectively on a side surface of the gate electrode layer;

forming a source region and a drain region in surface portions of the semiconductor substrate in a self-alignment manner with the gate electrode layer including the semiconductor film; and forming a gate insulation region, which has a dielectric constant lower than that of the gate insulation film, at a region between the semiconductor film and the substrate.

18. A method according to claim 17, wherein the forming of the gate insulation region with a lower dielectric constant than the gate insulation film includes forming, following the forming of the semiconductor film selectively on the side surface of the gate electrode layer, an interlayer insulation film on the semiconductor substrate so as to cover the gate electrode layer, and filling a portion of the interlayer insulation film as the gate insulation region, in the region between the semiconductor film and the substrate.

19. A method according to claim 17, wherein the forming of the gate insulation region with a dielectric constant lower than that of the gate insulation film includes forming, following the forming of the semiconductor film selectively on the side surface of the gate electrode layer, an interlayer insulation film on the semiconductor substrate so as to cover the gate electrode layer, the interlayer insulation film forming a void as the gate insulation region at a region among the gate insulation film, the semiconductor film and the substrate.

20. A method according to claim 17, wherein the forming of the semiconductor film selectively on the side surface of the gate electrode layer includes growing a silicon layer on the gate electrode layer formed of polysilicon.

21. A method according to claim 17, wherein the forming of the gate electrode layer over the semiconductor substrate with the gate insulation film interposed therebetween includes using, as material of the gate insulation film, at least one selected from the group consisting of titanium oxide, tantalum pentoxide, zirconium oxide, hafnium oxide, lanthanum oxide, aluminum oxide, yttrium oxide and scandium oxide.

* * * * *

UNITED STATES PATENT AND TRADEMARK OFFICE
CERTIFICATE OF CORRECTION

PATENT NO.    : 6,495,890 B1
DATED         : December 17, 2002
INVENTOR(S)   : Ono It is certified that error appears in the above-identified patent and that said Letters Patent is hereby corrected as shown below:

Title page,
Item [54], Title, change "FIELD-EFFECT" to -- FIELD EFFECT --; and change "MULTIDIELECTRIC" to -- MULTI-DIELECTRIC --.

Column 15,
Line 49, "film is a removed," to -- film is removed, --.

Column 16,
Line 27, change "film" to -- film, --.

Signed and Sealed this

Fifteenth Day of April, 2003

JAMES E. ROGAN
*Director of the United States Patent and Trademark Office*